United States Patent
Lin et al.

(10) Patent No.: US 8,168,529 B2
(45) Date of Patent: May 1, 2012

(54) FORMING SEAL RING IN AN INTEGRATED CIRCUIT DIE

(75) Inventors: Chuan-Yi Lin, Hsin-Chu (TW); Ching-Chen Hao, Zhubei (TW); Chen Cheng Chou, Shanhua Township (TW); Sheng-Yuan Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 12/618,412

(22) Filed: Nov. 13, 2009

(65) Prior Publication Data

US 2010/0187671 A1    Jul. 29, 2010

Related U.S. Application Data

(60) Provisional application No. 61/147,351, filed on Jan. 26, 2009.

(51) Int. Cl.
*H01L 21/4763* (2006.01)

(52) U.S. Cl. ........................ 438/622; 438/629

(58) Field of Classification Search ................. 438/629, 438/672, 675, 652, 622
See application file for complete search history.

(56) References Cited

U.S. PATENT DOCUMENTS

| | | | |
|---|---|---|---|
| 5,391,917 A | 2/1995 | Gilmour et al. | |
| 5,510,298 A | 4/1996 | Redwine | |
| 5,767,001 A | 6/1998 | Bertagnolli et al. | |
| 5,998,292 A | 12/1999 | Black et al. | |
| 6,184,060 B1 | 2/2001 | Siniaguine | |
| 6,322,903 B1 | 11/2001 | Siniaguine et al. | |
| 6,448,168 B1 | 9/2002 | Rao et al. | |
| 6,465,892 B1 | 10/2002 | Suga | |
| 6,472,293 B1 | 10/2002 | Suga | |
| 6,538,333 B2 | 3/2003 | Kong | |
| 6,599,778 B2 | 7/2003 | Pogge et al. | |
| 6,639,303 B2 | 10/2003 | Siniaguine | |
| 6,664,129 B2 | 12/2003 | Siniaguine | |
| 6,693,361 B1 | 2/2004 | Siniaguine et al. | |
| 6,740,582 B2 | 5/2004 | Siniaguine | |
| 6,800,930 B2 | 10/2004 | Jackson et al. | |
| 6,841,883 B1 | 1/2005 | Farnworth et al. | |
| 6,882,030 B2 | 4/2005 | Siniaguine | |
| 6,924,551 B2 | 8/2005 | Rumer et al. | |
| 6,962,867 B2 | 11/2005 | Jackson et al. | |
| 6,962,872 B2 | 11/2005 | Chudzik et al. | |
| 7,030,481 B2 | 4/2006 | Chudzik et al. | |
| 7,049,170 B2 | 5/2006 | Savastiouk et al. | |
| 7,060,601 B2 | 6/2006 | Savastiouk et al. | |

(Continued)

OTHER PUBLICATIONS

Beyne, E., et al., "3D System Integration Technologies," 2007 IEEE, pp. 1-3.

(Continued)

*Primary Examiner* — S. V. Clark
(74) *Attorney, Agent, or Firm* — Slater & Matsil, L.L.P.

(57) ABSTRACT

The formation of a seal ring in a semiconductor integrated circuit (IC) die is described. Through-silicon vias (TSVs) are typically formed in a semiconductor IC die to facilitate the formation of a three dimensional (3D) stacking die structure. The TSVs may be utilized to provide electrical connections between components in different dies of the 3D stacking die structure. A seal ring is formed in the inter-metal dielectric (IMD) layers of an IC die, enclosing an active circuit region. The real ring is formed prior to the formation of the TSVs, preventing moistures or other undesired chemical agents from diffusing into the active circuit region during the subsequent processes of forming TSVs.

14 Claims, 9 Drawing Sheets

U.S. PATENT DOCUMENTS

| | | | |
|---|---|---|---|
| 7,071,546 B2 | 7/2006 | Fey et al. | |
| 7,111,149 B2 | 9/2006 | Eilert | |
| 7,122,912 B2 | 10/2006 | Matsui | |
| 7,157,787 B2 | 1/2007 | Kim et al. | |
| 7,193,308 B2 | 3/2007 | Matsui | |
| 7,262,495 B2 | 8/2007 | Chen et al. | |
| 7,297,574 B2 | 11/2007 | Thomas et al. | |
| 7,335,972 B2 | 2/2008 | Chanchani | |
| 7,355,273 B2 | 4/2008 | Jackson et al. | |
| 7,615,841 B2 * | 11/2009 | Chen et al. | 257/508 |
| 7,906,836 B2 * | 3/2011 | Chen et al. | 257/675 |
| 2007/0018331 A1 * | 1/2007 | Chen | 257/774 |
| 2008/0191205 A1 * | 8/2008 | Tsai et al. | 257/48 |
| 2009/0134500 A1 * | 5/2009 | Kuo | 257/659 |
| 2009/0140393 A1 * | 6/2009 | Chen et al. | 257/620 |
| 2010/0123219 A1 * | 5/2010 | Chen et al. | 257/620 |
| 2010/0133696 A1 * | 6/2010 | Chen et al. | 257/774 |
| 2010/0171203 A1 * | 7/2010 | Chen et al. | 257/686 |

OTHER PUBLICATIONS

Kuo, T-Y., et al., "Reliability Tests for a Three Dimensional Chip Stacking Structure with Through Silicon Via Connections and Low Cost," 2008 Electronic Components and Technology Conference, pp. 853-858.

Pieters, P., et al., "3D Wafer Level Packaging Approach Towards Cost Effective Low Loss High Density 3D Stacking," 2006 IEEE, 2006 7th International Conference on Electronics Packaging Technology, 4 pages.

* cited by examiner

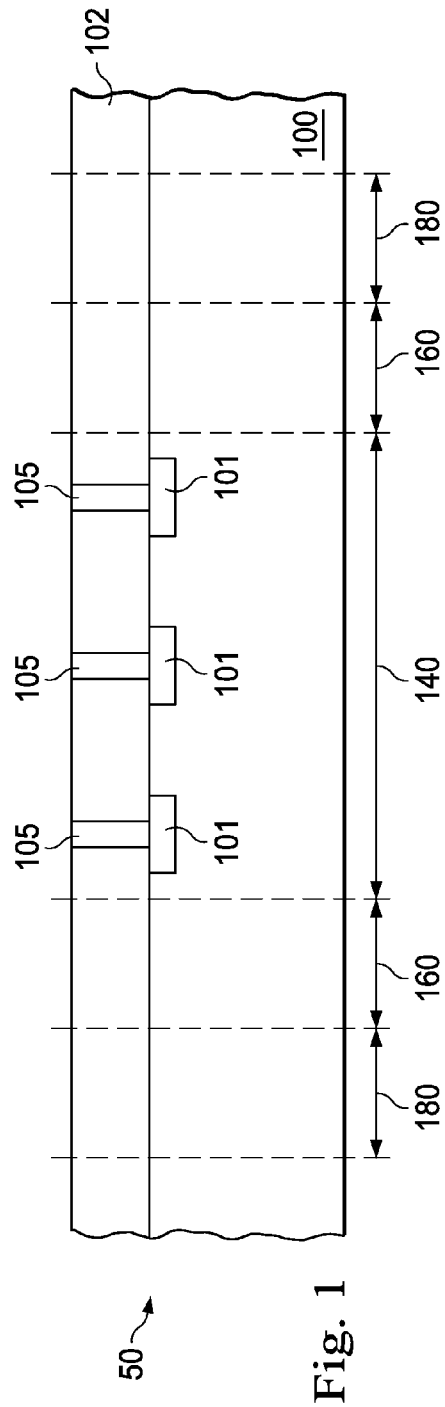
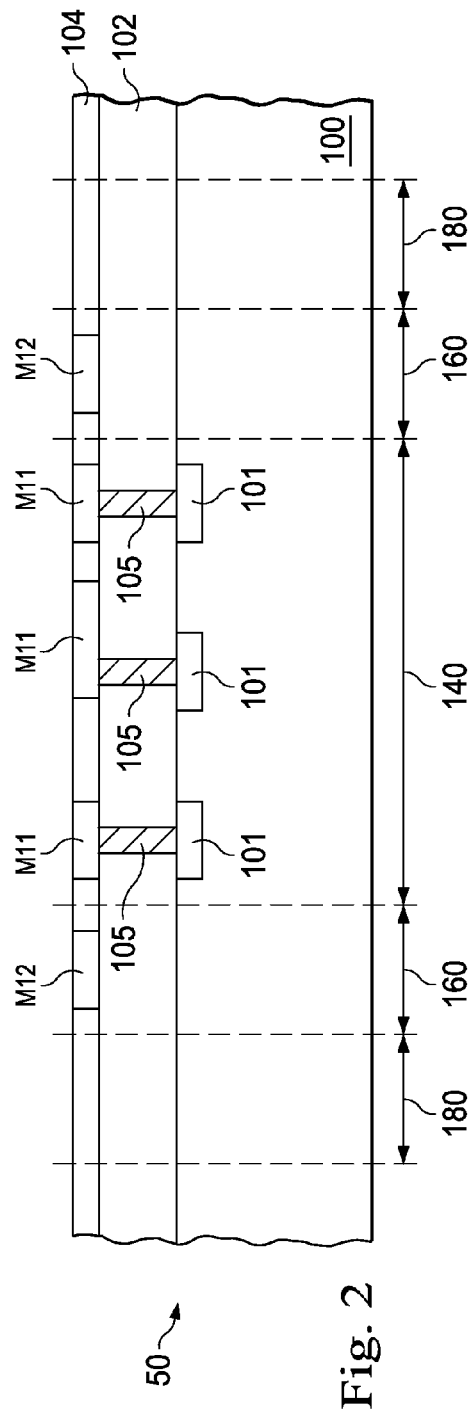

FORMING SEAL RING IN AN INTEGRATED CIRCUIT DIE

This application claims the benefit of U.S. Provisional Patent Application Ser. No. 61/147,351, filed on Jan. 26, 2009, and entitled "Forming Seal Ring in an Integrated Circuit Die," which application is incorporated herein by reference.

TECHNICAL FIELD

The present invention relates generally to integrated circuit fabrication and, more particularly, to a method of forming seal rings in a semiconductor integrated circuit (IC) die and the resulting stacked chip structure.

BACKGROUND

Generally, the speed at which an integrated circuit operates is influenced by the distance between the farthest separated components that communicate with each other on the chip. Stacking dies as three-dimensional structures has been shown to significantly reduce the communication path length between components on different dies, provided the vertical distances between the dies are much smaller than the die size of the individual die. Thus, by stacking dies vertically, the overall system speed is typically increased. One method that has been used to implement such stacking structure is through wafer bonding.

Wafer bonding is the joining together of two or more semiconductor wafers on which integrated circuitry has been formed. Wafers are typically joined by direct bonding of external oxide layers or by adding adhesives to external dielectric layers. The bonded result produces a three-dimensional wafer stack which is subsequently diced into separate "stacked die," with each individual stacking die structure having multiple layers of integrated circuitry. In addition to the increased system speed that the three-dimensional circuitry typically experiences, wafer stacking offers other potential benefits, including improved form factors, lower costs, and greater integration through system-on-chip (SOC) solutions. In order to enable the various components integrated within each stacking die structure, electrical connections, such as through-silicon vias (TSVs) are typically formed to provide conductors between vertical dies. TSVs are typically fabricated to provide vias filled with a conducting material that passes completely through a die to contact and connect with the other TSVs and conductors of the stacking die structure.

In an existing TSV formation process, TSV recesses are formed after the CMOS device formations in a wafer substrate and after the metallization process of forming metal traces in the inter-metal dielectric layers. In an IC fabricated with advanced processing technology, the inter-metal dielectric layers are typically formed with dielectric materials having low dielectric constant (low-k) or extremely low dielectric constant in an effort to reduce inter-metal layer parasitic capacitance, thus increasing signal speed and enhance signal integrity. As an example, a low-k dielectric material has a dielectric constant less than 2.9, and is formed with a porous organic dielectric material.

The TSV recesses formed in the inter-metal dielectric layers and in the substrate are subsequently filled with conductive metallic materials by a metallization process, such as a metallic chemical vapor deposition process (CVD) or a metal electroplating process. In order to facilitate the formation, a TSV recess typically has a large size with a large exposed surface area. This TSV formation process creates a number of problems in advanced processing technologies. One of the problems is that the formation of the TSV recesses in the inter-metal dielectric layers typically involves multiple etch processes; the wafers under processing often stand in queue for the various etch process to be completed. During processing, moisture or other chemical agents in a wafer processing facility may leach into the low-k inter-metal dielectric layers from the side wall of the TSV recesses and diffuse throughout the inter-metal dielectric layers, which may lead to undesired characteristic change of the low-k dielectric materials. Due to the large exposed surface area of the TSV recesses, this detrimental effect can be significant and cause serious device performance degradation and yield loss.

SUMMARY

These and other problems are generally solved or circumvented, and technical advantages are generally achieved, by preferred embodiments of the present invention which provide for the formation of seal rings in an integrated circuit (IC) die or wafer.

In a first aspect, the present invention provides for a device comprising a first die having a substrate. The substrate has formed thereon an active circuit region having one or more semiconductor devices. A plurality of metal interconnect layers are formed over the substrate, including a top metal interconnect layer. A through-silicon via (TSV) extends from the top metal interconnect layer through the substrate, and a seal ring is interposed between the active region and the TSV, the seal ring comprising a plurality of stacked features formed in respective ones of the plurality of metal interconnect layers.

In another aspect, the present invention provides for a method of forming a semiconductor device. The method includes forming one or more semiconductor devices in an active circuit region of a first semiconductor die, forming one or more inter-metal dielectric (IMD) layers over a front-side surface of the first semiconductor die, and forming interconnect metal features in the active circuit region, the interconnect metal features being coupled to the one or more semiconductor devices and being formed in respective ones of the one or more IMD layers. The method further includes forming a seal ring in the one or more IMD layers, the seal ring enclosing the interconnect metal features in the active circuit region, forming a recess in the one or more IMD layers and in the first semiconductor die, after the formation of the seal ring, the recess being separated from the active circuit region by the seal ring, and filling the recess with conductive material, thereby forming a through-silicon via (TSV).

In yet another aspect, the present invention provides for a method of forming through-silicon-vias (TSV) in a semiconductor device, including providing a semiconductor substrate, forming one or more inter-metal dielectric (IMD) layers on the semiconductor substrate, and forming one or more semiconductor devices in an active circuit region of the semiconductor substrate. The method further includes forming a plurality of interconnect metal features in the IMD layers in the active circuit region, forming a seal ring in the IMD layers, the seal ring enclosing the plurality of interconnect metal features in the active circuit region. One or more recesses are formed in a TSV region of the IMD layers and the semiconductor substrate, the TSV region being separated from active circuit region by the seal ring, and the one or more recesses are filled with one or more conductive materials, thereby forming one or more TSVs.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1-7 illustrate forming seal rings in a wafer according to an illustrative embodiment;

DETAILED DESCRIPTION OF ILLUSTRATIVE EMBODIMENTS

Figure 3A:
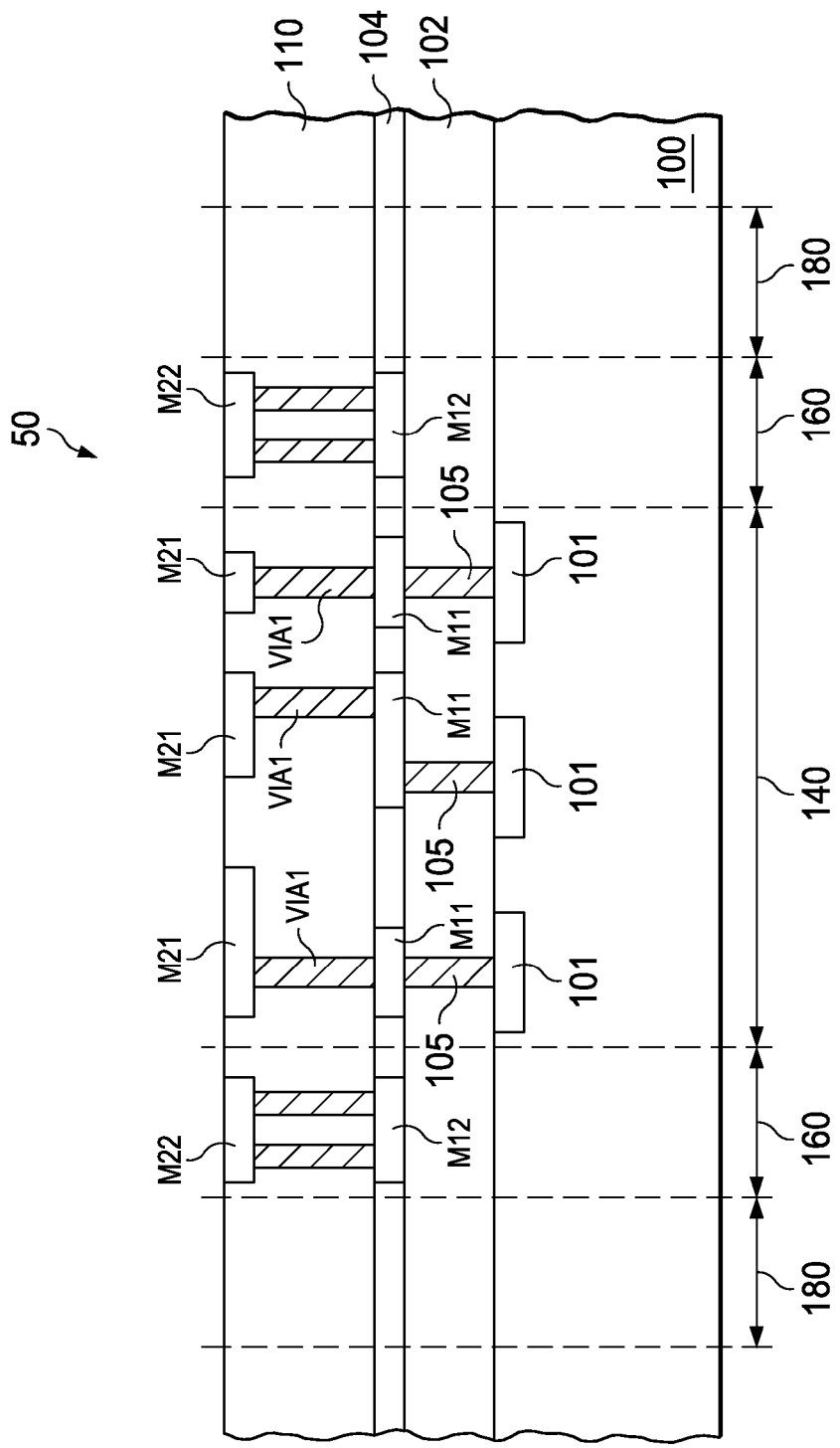

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

With reference now to FIG. 1, there is shown a cross-sectional diagram of a portion of wafer 50. The portion illustrated includes an active circuit region 140, a seal ring region 160, and TSV regions 180. In preferred embodiments, an active circuit region 140 defines a wafer surface area where semiconductor devices are formed in its underlying substrate area and coupled together to make functional circuit units; a seal ring region 160 defines a wafer surface area where one or more seal rings are formed in the wafer, preferably encompassing an adjacent active circuit region, in an effort to block moistures or other undesirable chemical agents from diffusing into an active circuit region 140 during the various wafer processing steps; a TSV region defines a wafer surface area where a through-silicon via is to be formed passing through wafer 50 in accordance to a pre-determined arrangement. The regions 140, 160, and 180 are typically formed adjacent to each other, but they may also be in separate locations on wafer 50. One skilled in the art will recognize that numerous active regions, seal ring regions, and TSV regions can, and typically will, be formed on a given die. For illustration, only one active region 140 is shown.

Wafer 50 comprises semiconductor substrate 100, which is typically silicon (Si), but may also be made of silicon germanium (SiGe), gallium arsenide (GaAs), gallium arsenide-phosphide (GaAsP), indium phosphide (InP), gallium aluminum arsenic (GaAlAs), indium gallium phosphide (InGaP), and the like, and illustrates devices 101 processed in active circuit region 140 in substrate 100. Wafer 100 could be a bulk wafer or could be a silicon-on-insulator (SOI) or similar type of wafer. While only three devices 101 are shown, there may be many active and passive semiconductor devices 101 formed in substrate 100.

Insulating layer (also sometimes referred to as inter-layer dielectric ILD layer) 102 is deposited on substrate 100 of wafer 50. In an embodiment, materials used to form ILD layer 102 include silicon dioxide ($SiO_2$), un-doped silicate glass (USG), phosphosilicate glass (PSG) and the like. A photolithography process may be used to pattern ILD layer 102, defining the electrical connections (contacts) 105 to the devices 101 previously formed in semiconductor substrate 100. An etch process, such as an anisotropic dry etch process, can be performed after the photolithography to form contact openings in ILD layer 102. Afterward, electrical contacts 105 to devices 101 may be formed by filling conductive materials in the contact openings by a metallization process, such as a metallic chemical vapor deposition (CVD) process. Conductive materials used to form contacts 105 include aluminum (AL), copper (Cu), tungsten (W), cobalt (Co), other metal or metal alloy, although other suitable conductive materials or processes may be also used to form contacts 105. A planarization process, such as a chemical mechanical polishing (CMP), may be then performed on the substrate surface to remove the excess contact materials, providing a substantially flat substrate surface preferable for the subsequent processing steps. In preferred embodiments, a barrier layer, such as a titanium nitride (TiN) layer (not show), may be formed by a suitable process on the bottom of the contact openings prior to the formation of contact 105. A barrier layer may prevent any metals deposited in the metallization process from leaching into ILD layer 102 and substrate 100.

Illustrated in FIG. 2, another dielectric layer 104, such as $SiO_2$ is added on the substrate through a CVD process, for example. A photolithography process may be used to pattern dielectric layer 104, and an etch process, such as an anisotropic dry etch process, can be performed after the lithography to cut trenches in dielectric layer 104. A metallization process, such as a metallic CVD process or an electroplating may be performed on wafer 50 filling the trenches with metallic conducting materials, where conductive features in a first interconnect metal layer (also sometimes referred to as M1 layer) are needed. The conducting materials used to form the first interconnect metal layer may comprise Cu, AL, W, and the like. A planarization process, such as a CMP process, may be then performed on the substrate surface to remove the metal outside the trenches, leaving only the desired metal features. Prior to the metallization process, a very thin layer of barrier material may be deposited by a process, such as a sputtering process, to line the trenches and act as a diffusion barrier to the first interconnect metal material.

In preferred embodiments, the metal features formed in the first interconnect metal layer includes metal features M11 that are formed in the active circuit region 140 and are typically used to provide electrical connections among the various semiconductor devices 101 formed in substrate 100 or electrical connections between a device 101 and conductive features in an overlying interconnect layer. It is noted, however, the metal features formed in the first interconnect metal layer after the metallization process also include metal features M12 in a seal ring region 160. A metal feature M12 in a seal ring region 160 forms a bottom portion of a seal ring. The processing steps of forming a seal ring in a seal ring region 160 will be described in detail below.

Figure 3B:
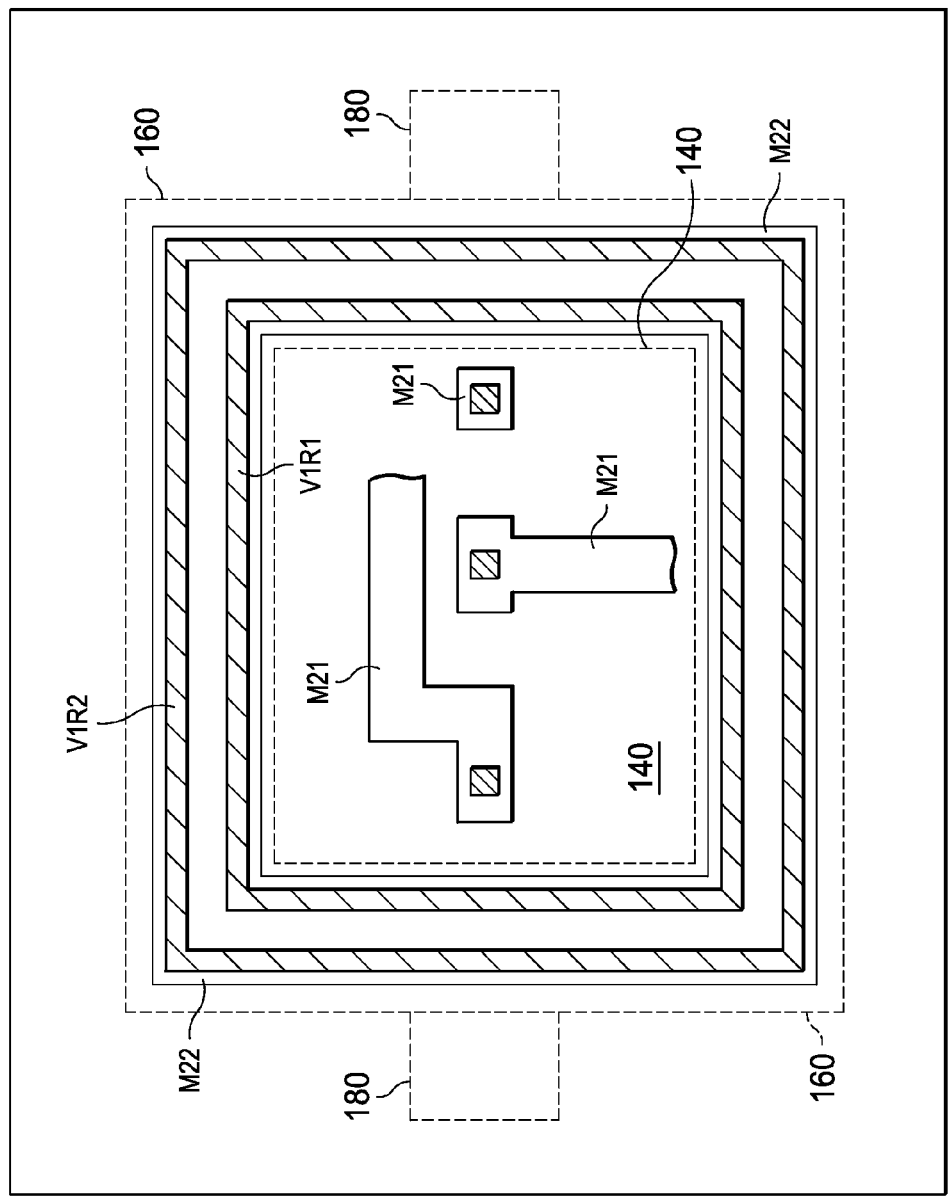

FIGS. 3a-3b illustrates forming a first inter-metal dielectric layer (also sometimes referred to as IMD layer) 110 over the substrate. In an embodiment, the first IMD layer comprises a low-k porous organic dielectric material selected from a group consisting of organic silicate glass (OSG), porous methylsilsesquioxane (p-MSQ), and hydrogen silsesquioxane (HSQ), although other organic dielectric materials comprising C, O and H may be also used. In another embodiment, inorganic porous low-k materials, such as carbon-doped silicon oxide layer or fluorine-doped silicate glass (FSG), may be used to form the first IMD layer 110. In an additional embodiment, other suitable dielectric materials, such as silicon dioxide ($SiO_2$) and phosphosilicate glass (PSG) may be also used. A dual damascene process is then performed to form via openings and trenches in the first IMD layer 110. A metallization process, such as a metallic CVD process or an electroplating process may be performed on wafer 50 filling the via openings and trenches with metallic conducting materials, forming vias and conductive features in the first IMD layer 110 preferably through a common processing flow. Vias thus formed in the first IMD layer 110 are generally referred as "via1," and conductive features formed from the above dual damascene process are also generally referred to as M2 features in the second interconnect metal layer. Via1 and M2 features formed in the first IMD layer 110 are typically coupled to the metal features previously formed in the first interconnect layer. The conducting materials used to form via1 and M2 features may comprise Cu, AL, W, and the like, although other suitable conductors may be also used. Similarly, a planarization process, such as a CMP process, may be then performed on the substrate surface to remove the excess metal outside the trenches and to provide the desired flat substrate surface for the subsequent processing steps.

It is shown from FIG. 3a that the metal features formed in the first IMD layer include metal traces M21 in the active circuit region 140, which are typically used to provide electrical connections among the various semiconductor devices 101 and the metal traces in the various interconnect metal layers. The metal features formed in the first IMD layer 110 also include metal feature M22 in a seal ring region 160. Metal feature M22 overlies a metal feature M12 previously formed in the first interconnect metal layer, and are substantially aligned with the edge of an underlying metal plate M12. FIG. 3b illustrates that metal feature M22 is a ring of square shape that is aligned with the edges of the underlying metal feature M12 and is coupled to M12 through a first and a second via1 rings "V1R1" and "V1R2" in the first IMD layer 110.

It should be noted that, the first and the second via1 rings "V1R1" and "V1R2" are shown as a double ring structure encircling the active circuit region 140 for illustrative purposes only. Other embodiments may use a single via1 ring configuration, for example, to reduce footprint. Also, the via1 rings in FIG. 3b are shown as square rings for illustrative purposes only. Other embodiments may have different via1 ring shapes, such as squares, rectangles, polygon shapes that preferably match the periphery of an active circuit region. A via1 ring in preferred embodiments is not limited to any specific shape, but preferably, is a closed ring substantially aligned with the periphery of an active circuit region, thereby preventing undesirable agents from diffusing into an active circuit region through a porous IMD layer during the various wafer processing steps. It should further be noted that the seal ring need not be a complete "ring." It is within the contemplated scope of the present invention that in some embodiments, rings M12, M22, etc. will be only partial structures with gaps between adjacent portions of the ring. In other words, the rings could be comprised of a series of separate islands that collectively form a ring structure, but which do not form a continuous, unbroken structure. In yet other embodiments, the features need not form a complete ring at all, provided the features are of sufficient placement and size to prevent deleterious affects of the TSV formation processes from impacting the active region. In one such embodiment, the metal features could be simply rectangular structures (seen from plan view) interposed between TSVs and portions of active region 140.

Figure 4:
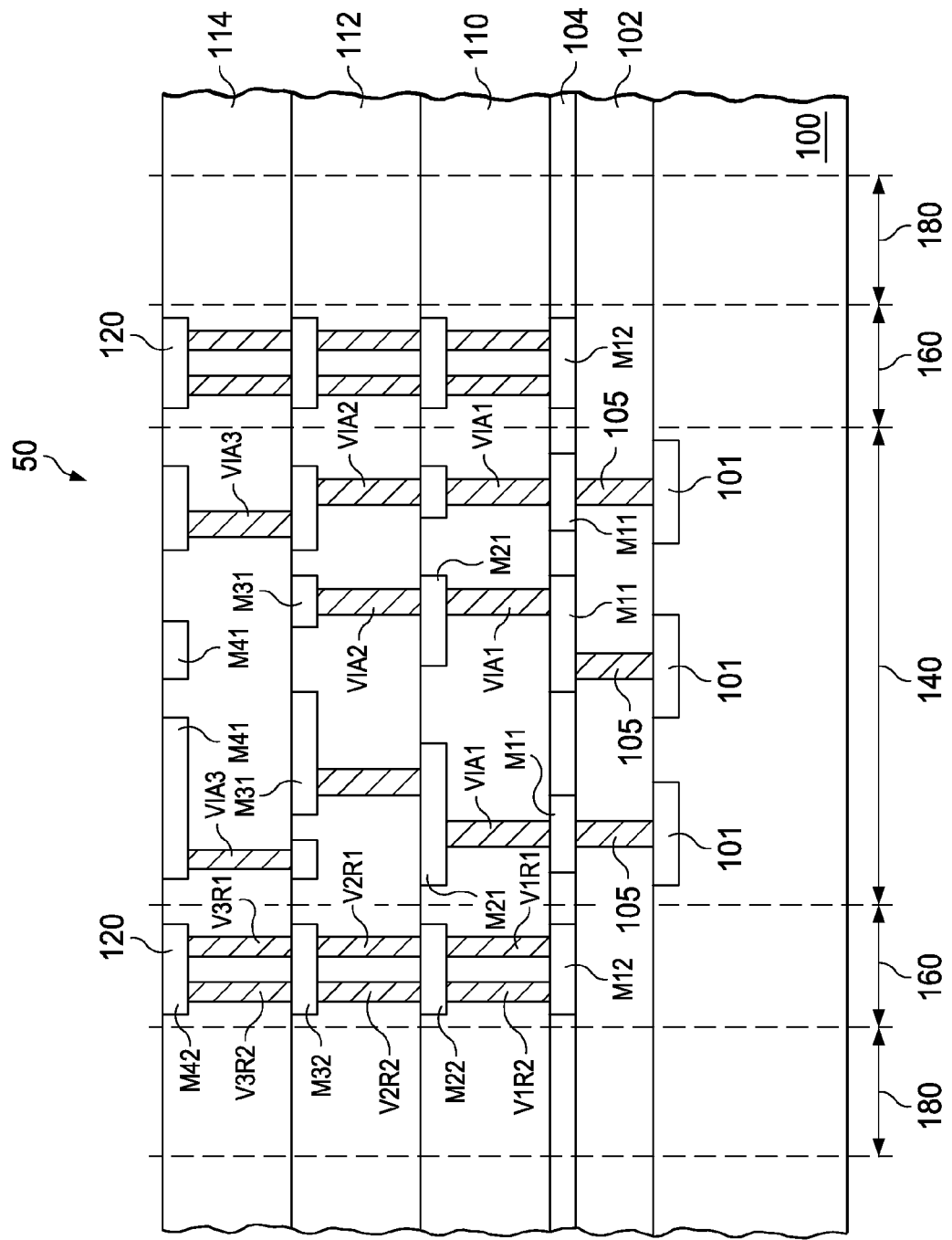

In FIG. 4, it is shown that similar processing steps may be repeated to form metal traces M31 and via2 in a second IMD layer 112, metal traces M41 and via3 in a third IMD layer 114 in the active circuit region 140. In the seal ring region 160, metal ring M32 is formed in IMD layer 112, and metal ring M42 is formed in IMD layer 114. Metal rings M42, M32 and M22 overlie and substantially aligned with each other, and are coupled through via3 rings V3R2 and V3R1 in IMD layer 114, via2 rings V2R2 and V2R1 in IMD layer 112, and via1 rings V1R1 and V1R2. In an embodiment, the outer edges of the metal rings M42, M32 and M22 are substantially aligned with the outer edges of via rings V3R2, V2R2 and V1R2. Although only four interconnect metal layers are shown in FIG. 4, it is understood that similar metal features can be formed in the upper interconnect metal layers as well until the uppermost interconnect metal layer. Therefore, M41 and M42 in FIG. 4 may also indicate similar metal features formed in upper interconnect metal layers. Up to this point, there is formed a stacking structure 120 in the seal ring region 160 of wafer 50, which encompasses an adjacent active circuit region 140 in the IMD layers. In preferred embodiments, stacking structures 120 thus formed on a wafer is also interchangeably referred to as seal ring 120. Again, while four metal layers are shown in the illustrative embodiments, the present invention is equally applicable to process flows having any number of metal layers.

Figure 5:
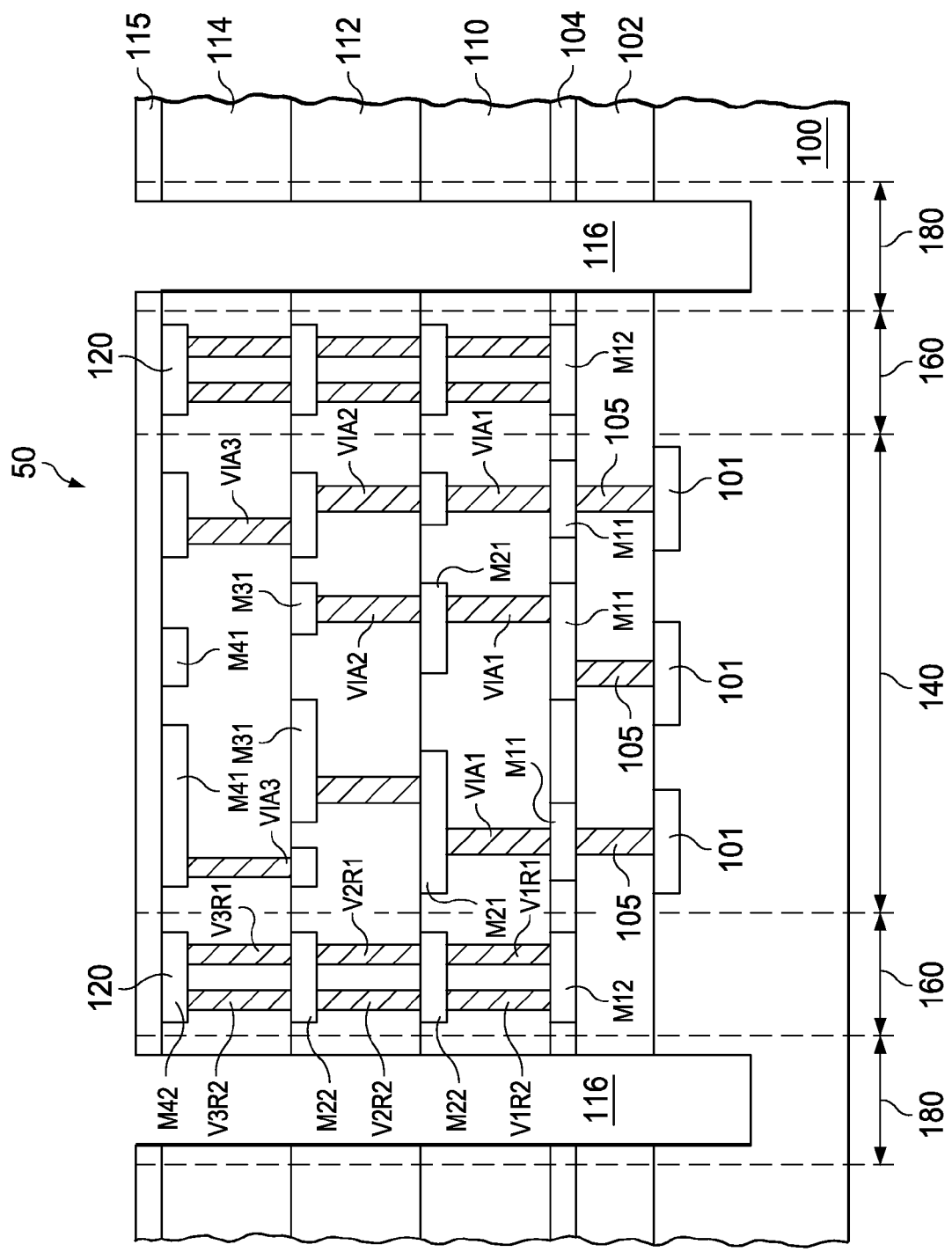

Illustrated in FIG. 5, a mask layer is formed on wafer 50. The mask layer is patterned and etched using photolithography and etch processes known in the art to form a patterned mask layer 115, forming openings exposing the wafer surface in a TSV region 180 where TSVs are to be formed in wafer 50. The patterned mask layer 115 is preferably a hard mask layer comprising a dielectric material, such as silicon nitride (SiNx) or silicon dioxide ($SiO_2$), in a single or multiple-layer configuration, although other suitable organic or inorganic hard mask materials may be also used. Alternatively, a patterned photoresist may be also used to form patterned mask layer 115. In an embodiment where silicon nitride is used for the patterned mask layer 430, it preferably has a thickness of about 50 μm to about 500 μm.

Remaining in FIG. 5, wafer 50 is then processed with a first etch process, preferably a dry, anisotropic etch process, to remove IMD layers in the patterned TSV region 180. In an embodiment, IMD layers 114, 112 and 110 comprises similar low-k dielectric materials, the first etch process has a high etch selectivity rate of low-k material to the dielectric layer 104. The first etch process proceeds into wafer 50 until the IMD layers under the patterned TSV region are substantially removed. Afterwards, wafer 50 is processed with a second etch process, preferably a dry, anisotropic etch process, in the recesses created from previous processing step to remove the material of dielectric layer 104 and ILD layer 102 under the patterned TSV region. Subsequently, wafer 50 is processed with a third etch process, preferably a dry, anisotropic etch process, in the recesses created from previous processing step to remove substrate material under the patterned TSV region. In an embodiment, the third etch process is a time-controlling anisotropic plasma etch process that etches silicon to create deep recesses in silicon substrate 100. After the etch processes, deep recesses 116 are formed in the TSV regions 180 on wafer 50, as shown.

It is noted, during the above etch processes applied to create recesses 116, moisture and the various etchants employed in the etch processes may diffuse into the IMD layers, which typically comprise porous dielectric materials in advanced processing technology. However, as can be appreciated, the diffusion of these undesired species is substantially blocked from diffusing into an adjacent active circuit region 140 on wafer 50 by seal ring 120, which is formed from previous process steps sealing the active circuit region 140. After the formation of the TSV recesses in wafer 50, patterned mask layer 114 may be subsequently removed by known processing techniques.

Illustrated in FIG. 6, a metallization process, such as metallic CVD or metal plating, may be subsequently performed on wafer 50, filling copper (Cu) or the suitable conductive materials in the TSV recesses to form TSVs 125 in wafer 50. Other suitable conductive materials, such as aluminum (Al), tungsten (W), cobalt (Co), gold (Au), silver (Ag), platinum (Pt), silicon (Si) and other suitable deposition processes may be also used to form TSVs 125. A CMP process may be performed afterwards on the substrate to remove excess TSV materials and provide the desired flat substrate surface for the subsequent processing steps. Optionally, a barrier layer 117, such as a titanium nitride (TiN) layer and/or a metal seed layer (not shown), may be formed conformally in the TSV recesses by suitable processes, such as CVD or physical vapor deposition (PVD), prior to the metallization process of forming TSVs 125. A barrier layer 117 in TSV recesses may prevent any conducting TSV material from leaching into any active portions of the circuitry of wafer 50.

Figure 6:
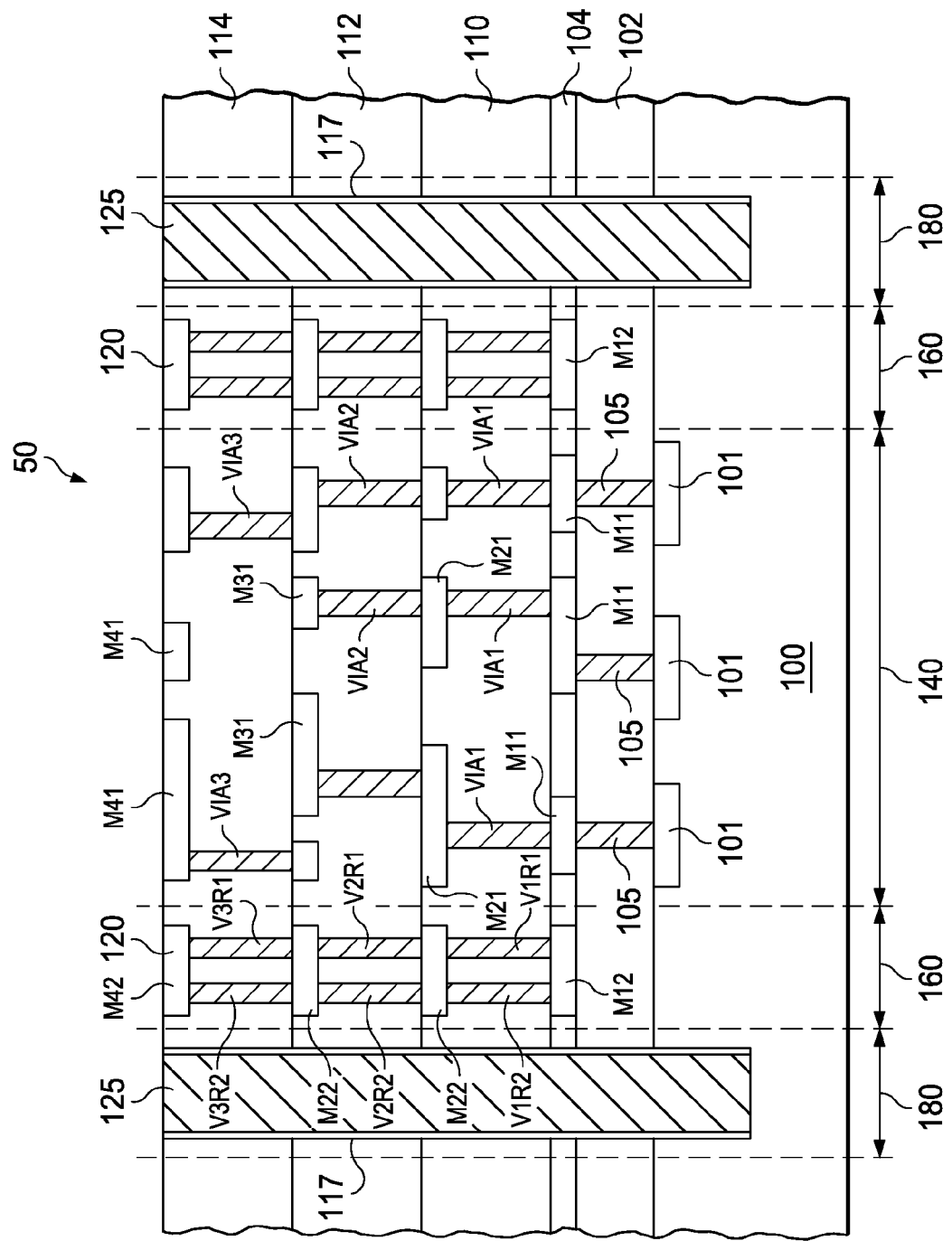
Figure 7:
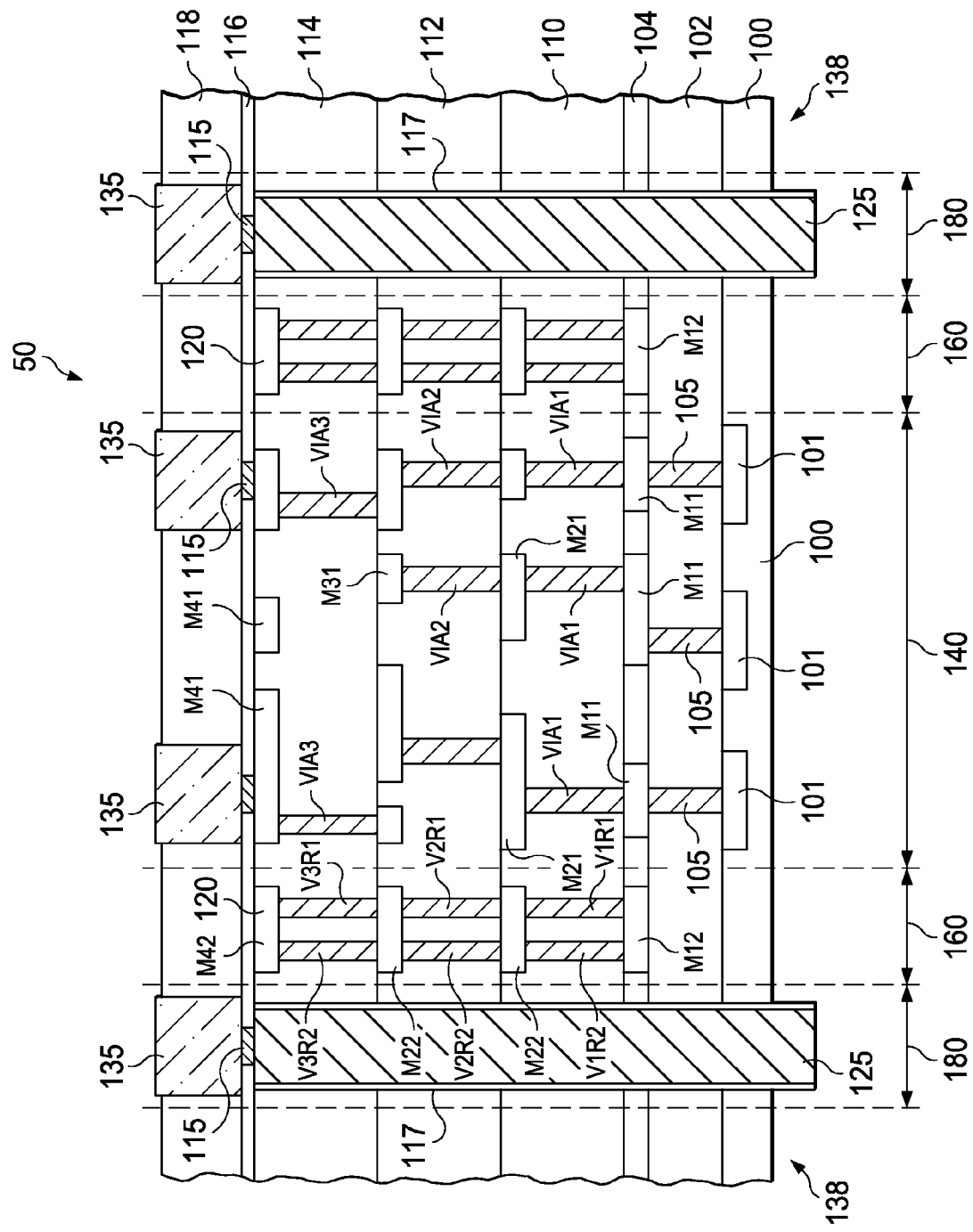

FIG. 7 illustrates that that an insulating layer 116 is formed atop the wafer 50 surface from previous processing steps (e.g., FIG. 6). Insulating layer 116 insulates devices and interconnect metal features in wafer 50 from any other circuitry or devices in any wafers/dies bonded to wafer 50. Insulating layer 116 may also prevent any harmful materials from leaching into any active portions of the circuitry of wafer 50. In an embodiment, PSG, undoped silicate glass (USG) or silicon nitride is deposited through a plasma enhanced CVD (PECVD) to form insulating layer 116, although other suitable materials and processes may be also used. Conductive interfaces 115 are patterned and formed in insulating layer 116 through techniques known in the art, providing electrical connections between conductive features in an active circuit region 140 to a contact pad 135, and electrical connection between a TSV 125 to a contact pad 135.

An additional dielectric layer 118 is formed atop the wafer 50 surface. Materials and processing techniques used to form insulating layer 116 may be used to form dielectric layer 118, although other suitable materials and processes may be also used. Bonding pads 135 are formed in dielectric layer 118 and are electrically coupled to the metal features in the active circuit region 140 and TSVs in the TSV regions 180 through conductive interfaces 115 embedded in insulating layer 116. Conductive materials used to form bonding pads 135 comprise aluminum (Al), copper (Cu), tungsten (W), cobalt (Co), gold (Au), silver (Ag), a copper-tin alloy, a gold-tin alloy, an indium-gold alloy, a lead-tin alloy, or the like, although other suitable conductive materials may be also used. It is also noted that conductive interfaces 115 may be a direct connection between a bonding pad and an underlying conductive feature in an active circuit region 140 or a TSV 125, as shown. A conductive interface 115 may also comprise an indirect connection through a conductive redistribution feature formed in insulating layer 116. The various embodiments of the present invention are not limited to only direct connections between a bonding pad 135 and an underlying conductive feature or a TSV.

The substrate 100 may be then thinned from a back-side 138 through known techniques, such as back grinding, etching, CMP, or the like, and portions of substrate 100 are removed to reveal contact points with TSVs 125. The elevated portion of TSVs 125 over the back-side 138 of substrate 100 may facilitate bonding wafer 50 to another integrated circuit wafer or die. Wafer 50 processed through the above processing steps may be bonded to other integrated circuit wafers and dies through bonding pads 135 on the front-side or through the elevated portion of TSVs 125 over the back-side 138.

Figure 8:
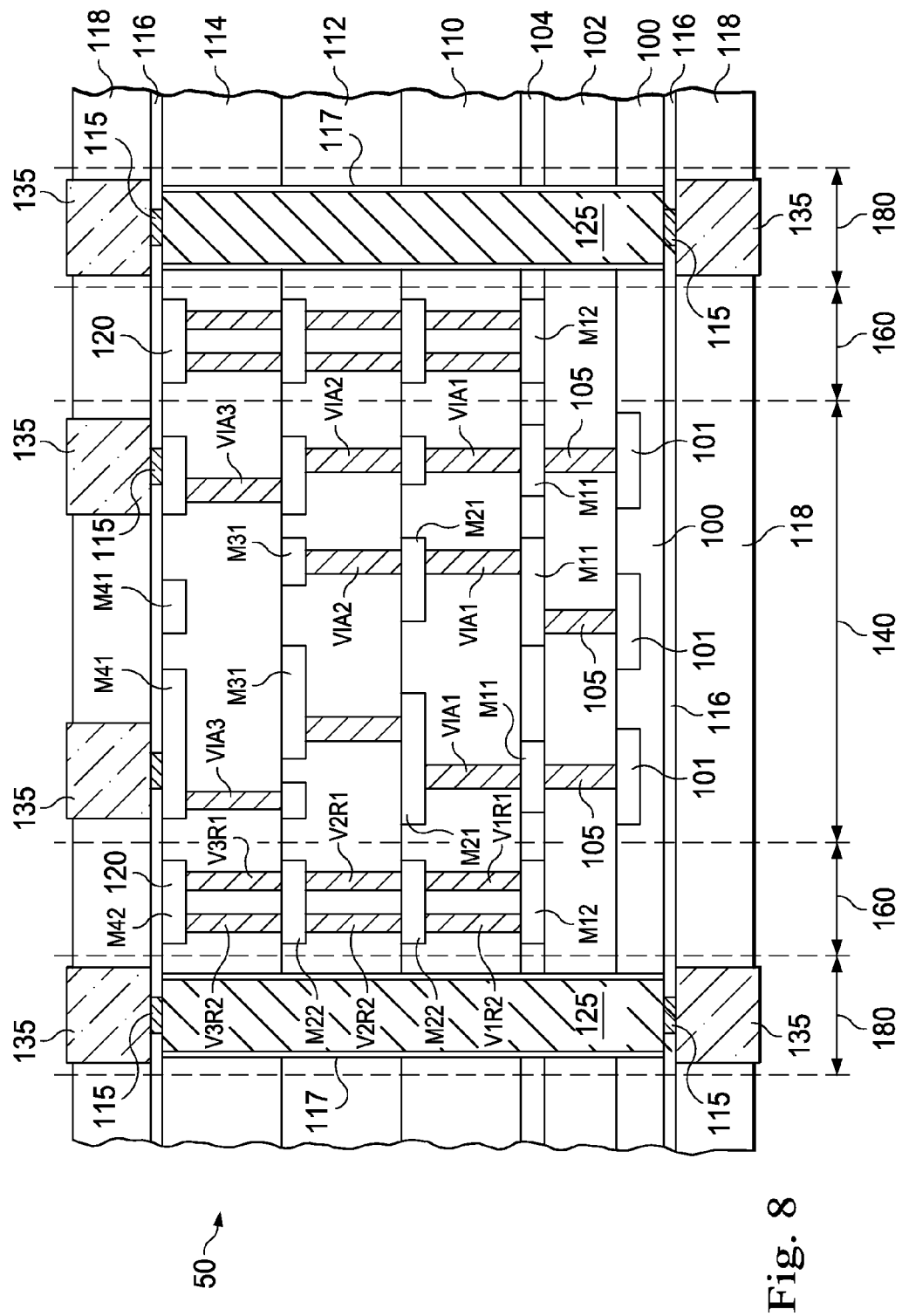
FIG. 8 is a cross-sectional view illustrating a wafer with seal rings according to an illustrative embodiment.

FIG. 8 illustrates that wafer 50 from FIG. 7 may be further processed to form insulating layer 116, dielectric layer 118, conductive interface 115, bonding pads 135 over the back-side 138 of substrate 100 with similar materials and processing techniques used for the similar features formed previously over the front-side of wafer 50. Wafer 50 thus processed may be bonded to other integrated circuit wafers and dies from both sides. As one advantageous feature, bonding pads 135 on the back-side of wafer 50 may adapt TSVs 125 in wafer 50 having a first pitch to other integrated circuit wafers and dies with bonding pads having a different pitch. As another advantageous feature, insulating layer 116 and dielectric layer 118 on the back-side of wafer 50 may prevent undesirable species from leaching into wafer 50 from the substrate 100 during the various wafer processing steps.

In an embodiment, a TSV 125 formed through the above processing steps may be electrically coupled to devices 101 in wafer 50 through metal traces in the various interconnect metal layers. In another embodiment, a TSV 125 thus formed may be used as a "feed-through" passing the wafer 50, coupling devices in a wafer bonded to one side of wafer 50 to devices in a wafer bonded to the other side of wafer 50.

It should be noted that, although the term "wafer" is used to illustrate the preferred embodiments, in practice, wafer 50 may be either a wafer or a die, thus a stacking die structure comprising wafer 50 in preferred embodiments may have a die-to-die stacking configuration, a die-to-wafer stacking configuration, or a wafer-to-wafer stacking configuration.

Figure 9:
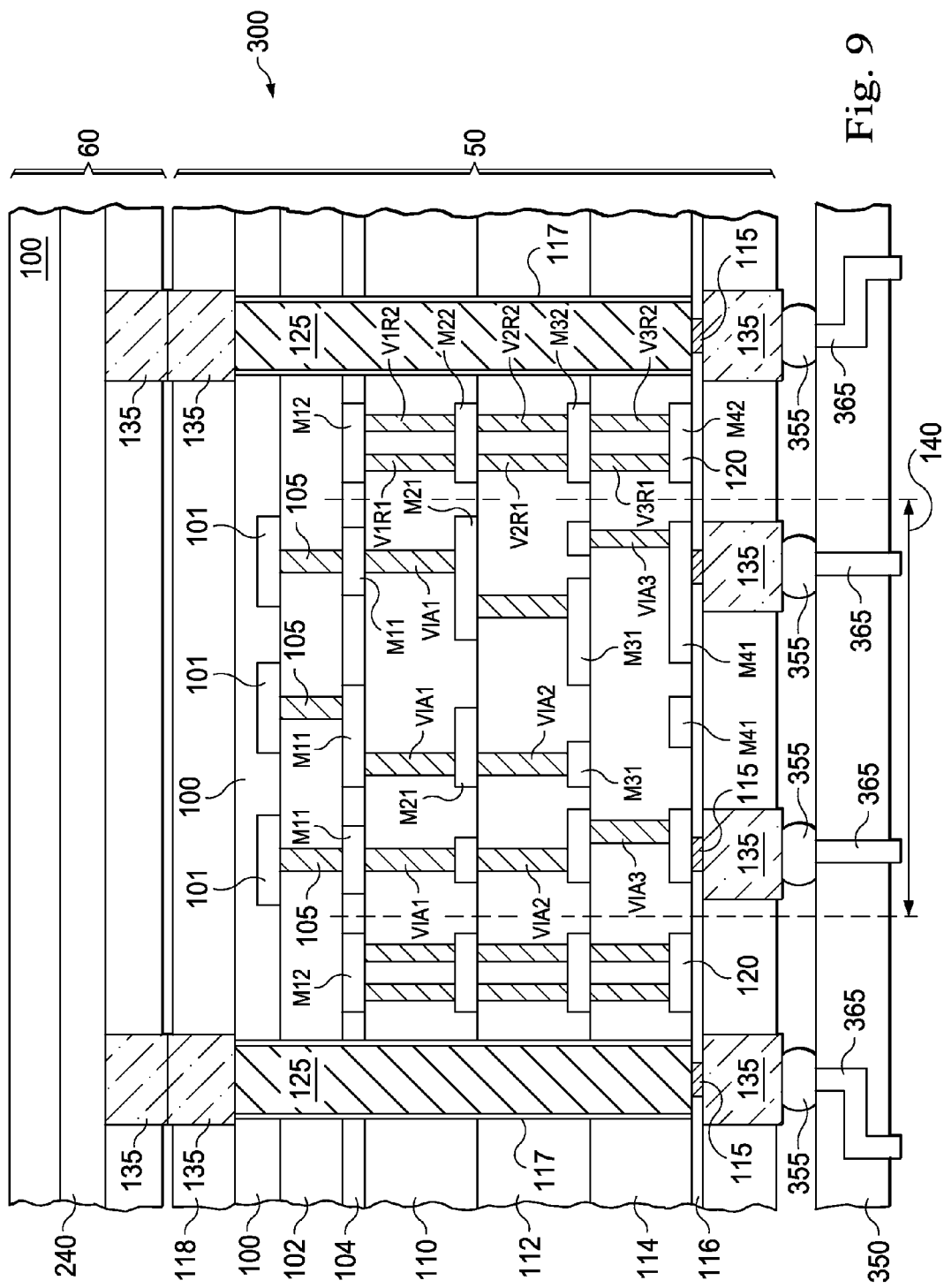
FIG. 9 is a cross-sectional view illustrating an electronic package according to an illustrative embodiment.

FIG. 9 illustrates a sectional view of an electronic package 300 embodying a 3D stacking die structure in one preferred embodiment. The 3D stacking die structure comprises a die 50 with a seal ring 120, such as that described with respect to FIG. 8. Die 50 is electrically coupled to an overlying die 60 through bonding pads 135 on a back-side bonding surface of die 50 and corresponding bonding pads 135 on a front-side bonding surface of die 60. Die 60 may also have bonding pads on other its bonding surfaces. In an embodiment, die 60 may be a semiconductor die similar to die 50, which includes semiconductor devices (not shown) from in substrate 100 and interconnect traces (not shown) formed in dielectric layer 240. However, die 60 may also be a die with heterogeneous devices optimized to other system functions.

The bond pads 135 on the back-side of die 50 are attached to package substrate 350 through solder balls 355, which in turn make electrical connection to a printed circuit board (not shown) through package leads 365. FIG. 9 illustrates that the stacking die structure made of dies 50 and 60 is attached to package substrate 350 to form IC package 300 in a flip-chip ball grid array (BGA) configuration. It is noted that other IC packaging schemes may be also used to package a stacking die structure in the preferred embodiments. As another example, the stacked dies may be solder-bonded directly to a printed circuit board. The specific packaging scheme illustrated herein is not intended to limit the embodiments of the present invention in any way. Also, stacking die structures in the preferred embodiments may include dozens or even hundreds or more of bonding contacts, such as bonding pads, contacts, balls, leads, etc., for making electrical connection to an IC package, for example, although only a number of bonding pads 135 and solder balls 355 are shown.

It should also be noted that each of the example wafers and dies described and illustrated above are meant to provide alternative implementations of devices, interconnect metal features, vias, TSVs, bonding contacts that may be used with various embodiments of the present invention. In additional and/or alternative embodiments of the present invention, any combination of the illustrated options and any equivalent devices and configurations may be used. The illustrated embodiments are not intended to limit the implementation of the various additional and/or alternative embodiments of the present invention.

It should further be noted that the different layers described in the illustrated embodiments may comprise various different materials depending on the desired function or availability that the manufacturer determines. The metals used for the metalized bonding contacts may be any suitable metal or alloy, such as copper, tungsten, aluminum, aluminum-copper, and the like. Moreover, depending on the desired use or function of the different dielectric or insulating layers, any such dielectric material may be used, such as silicon dioxide, silicon nitride, USG, PSG, low-k dielectric material, and the like. The present invention is not limited to use with only a certain limited number of compounds and materials.

It should further be noted that the different layers and recesses in the illustrative embodiments may be deposited or created using any number of a variety of known processes. For example, creation of the various layers of oxides, dielectrics, or other layers may be accomplished through PVD, CVD, PECVD, atomic layer deposition (ALD), or the like. Moreover, removing material from the wafer may be accomplished through dry or wet etching, chemical mechanical polishing CMP, or the like. The present invention is not limited to any single such method.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor device, the method comprising:
   forming one or more semiconductor devices in an active circuit region of a first semiconductor die;
   forming one or more inter-metal dielectric (IMD) layers over a front-side surface of the first semiconductor die;
   forming interconnect metal features in the active circuit region, the interconnect metal features being coupled to the one or more semiconductor devices and being formed in respective ones of the one or more IMD layers;
   forming a seal ring in the one or more IMD layers, the seal ring enclosing the interconnect metal features in the active circuit region;
   forming a recess in the one or more IMD layers and in the first semiconductor die, after the formation of the seal ring, the recess being separated from the active circuit region by the seal ring; and
   filling the recess with conductive material, thereby forming a through-silicon via (TSV).

2. The method of claim 1, wherein the seal ring comprises a plurality of stacked metal, rings in a plurality of interconnect metal layers in the one or more IMD layers, the respective stacked metal rings being connected together through one or more via.

3. The method of claim 1, wherein the seal ring has a shape selected from a group consisting of a square, a rectangle, a polygon, a continuous curve, and a discontinuous curve, and wherein the seal ring is substantially aligned with a periphery of the active circuit region.

4. The method of claim 1, wherein the seal ring is a continuous metallic feature surrounding the active circuit region.

5. The method of claim 1, wherein the forming the plurality of interconnect metal features in the active circuit region and the forming the seal ring are performed through a common processing flow.

6. The method of claim 1, wherein the one or more conductive materials is selected from the group consisting essentially of copper, tungsten, aluminum, cobalt, gold, silver, platinum, silicon and combinations thereof.

7. The method of claim 1 further comprising:
   forming a first insulating layer over the one or more IMD layers;
   forming a first dielectric layer on the first insulating layer; and
   forming a first bonding contact on the first dielectric layer, wherein the first bonding contact is coupled to the TSV and to at least one of the plurality of interconnect metal features through a redistribution features in the first insulating layer.

8. The method of claim 7 further comprising:
   forming a second insulating layer on a back-side surface of the semiconductor die;
   forming a second dielectric layer on the second insulating layer; and
   forming a second bonding contact on the second dielectric layer, wherein the second bonding contact is coupled to a second TSVs through a second redistribution feature in the second insulating layer.

9. The method of claim 7 further comprising:
   bonding the first semiconductor die to a second semiconductor die through the first bonding contact on the first semiconductor die and a corresponding bonding contact on the second semiconductor die.

10. A method of forming through-silicon-vias (TSV) in a semiconductor device, the method comprising:
    providing a semiconductor substrate;
    forming one or more inter-metal dielectric (IMD) layers on the semiconductor substrate;
    forming one or more semiconductor devices in an active circuit region of the semiconductor substrate;
    forming a plurality of interconnect metal features in the IMD layers in the active circuit region;
    forming a seal ring in the IMD layers, the seal ring enclosing the plurality of interconnect metal features in the active circuit region;
    forming one or more recesses in a TSV region of the IMD layers and the semiconductor substrate, the TSV region being separated from active circuit region by the seal ring; and
    filling the one or more recesses with one or more conductive materials, thereby forming one or more TSVs.

11. The method of claim 10, wherein the seal ring comprises a plurality of stacked metal rings in the one or more IMD layers, the stacked metal rings being connected together through one or more via rings in the one or more IMD layers.

12. The method of claim 10, wherein the forming the active circuit region and the forming the seal ring are performed through a common processing flow, prior to the forming the one or more recesses in the one or more IMD layers in the TSV region.

13. The method of claim 10, wherein forming a seal ring comprises forming a plurality of stacked ring features in respective ones of the IMD layers and interconnecting the stacked ring features with a plurality of stacked via structures.

14. The method of claim 10, wherein the forming the one or more recesses is performed at least in part by a first etching process removing the one or more IMD layers, followed by a second etch process etching the semiconductor substrate.

* * * * *

UNITED STATES PATENT AND TRADEMARK OFFICE
CERTIFICATE OF CORRECTION

PATENT NO. : 8,168,529 B2
APPLICATION NO. : 12/618412
DATED : May 1, 2012
INVENTOR(S) : Lin et al.

It is certified that error appears in the above-identified patent and that said Letters Patent is hereby corrected as shown below:

In Col. 9, line 64, claim 2, delete "," after "metal".

Signed and Sealed this
Fourteenth Day of August, 2012

David J. Kappos
*Director of the United States Patent and Trademark Office*